(12) United States Patent
Zhang

(10) Patent No.: US 10,573,832 B2
(45) Date of Patent: Feb. 25, 2020

(54) FLEXIBLE SUBSTRATE AND MANUFACTURING METHOD THEREOF, AND FLEXIBLE DISPLAY DEVICE

(71) Applicants: BOE TECHNOLOGY GROUP CO., LTD., Beijing (CN); Chengdu BOE Optoelectronics Technology Co., Ltd., Sichuan Province (CN)

(72) Inventor: Junrui Zhang, Beijing (CN)

(73) Assignees: BOE TECHNOLOGY GROUP CO., LTD., Beijing (CN); CHENGDU BOE OPTOELECTRONICS CO., LTD., Chengdu (CN)

( * ) Notice: Subject to any disclaimer, the term of this patent is extended or adjusted under 35 U.S.C. 154(b) by 14 days.

(21) Appl. No.: 15/964,382

(22) Filed: Apr. 27, 2018

(65) Prior Publication Data

US 2019/0067604 A1 Feb. 28, 2019

(30) Foreign Application Priority Data

Aug. 25, 2017 (CN) .......................... 2017 1 0742314

(51) Int. Cl.
*H01L 51/00* (2006.01)
*H01L 51/56* (2006.01)
*G02F 1/1333* (2006.01)

(52) U.S. Cl.
CPC .... *H01L 51/0097* (2013.01); *G02F 1/133305* (2013.01); *H01L 51/56* (2013.01);
(Continued)

(58) Field of Classification Search
CPC ..... H01L 51/0097; H01L 51/56; H01L 21/56; H01L 21/565; H01L 23/5389
See application file for complete search history.

(56) References Cited

U.S. PATENT DOCUMENTS

2015/0195915 A1* 7/2015 Namkung ............... B32B 37/26
361/750
2015/0200177 A1* 7/2015 Foong ................... H01L 21/561
257/693
(Continued)

FOREIGN PATENT DOCUMENTS

| CN | 102176435 A | 9/2011 |
|---|---|---|
| CN | 102496599 A | 6/2012 |
| CN | 105280841 A | 1/2016 |

OTHER PUBLICATIONS

First Office Action for Chinese Patent Application No. 201710742314.2 dated Jul. 1, 2019.

*Primary Examiner* — Zandra V Smith
*Assistant Examiner* — John M Parker
(74) *Attorney, Agent, or Firm* — Calfee, Halter & Griswold

(57) ABSTRACT

A method for manufacturing a flexible substrate includes: providing a carrier substrate; forming a photosensitive adhesive layer on the carrier substrate; providing a flexible substrate including an active area and a non-active area on the photosensitive adhesive layer; the photosensitive adhesive layer including a first area and a second area, curing photosensitive adhesive in the first area with light irritation, and leaving photosensitive adhesive in the second area uncured; forming an element on the flexible substrate, such that an orthographic projection of the non-active area on the carrier substrate covers an orthographic projection of the first area on the carrier substrate, and an orthogonal projection of the second area on the carrier substrate covers an orthogonal projection of the active area on the carrier substrate; cutting the carrier substrate along a boundary between the non-active area and the active area of the element.

7 Claims, 2 Drawing Sheets

(52) U.S. Cl.
CPC ............ *G02F 2001/133388* (2013.01); *H01L 2251/5338* (2013.01)

(56) References Cited

U.S. PATENT DOCUMENTS

2018/0198094 A1\* 7/2018 Yu ........................... H01L 51/56
2019/0157623 A1\* 5/2019 Qin .......................... H01L 51/56

\* cited by examiner

FLEXIBLE SUBSTRATE AND MANUFACTURING METHOD THEREOF, AND FLEXIBLE DISPLAY DEVICE

CROSS REFERENCE TO RELATED APPLICATIONS

This application claims the priority of the Chinese Patent Application No. 201710742314.2 filed on Aug. 25, 2017 and entitled "flexible substrate and manufacturing method thereof, and flexible display device", the entire contents of which are hereby incorporated by reference.

TECHNICAL FIELD

The present disclosure relates to the technical field of display apparatuses, and in particular, to a flexible substrate and a manufacturing method thereof, and a flexible display device.

BACKGROUND

Currently, flexible display devices, including flexible organic light emitting diodes (OLEDs), flexible liquid crystal displays (LCDs), flexible electronic papers, and the like are manufactured with a commonly used manufacturing method: coating or adhering on a rigid substrate (typically a glass substrate) a flexible film substrate; and after a display device is formed, peeling the flexible film substrate with the display device from the rigid substrate. Polyimide (PI) is often used as a flexible film substrate in flexible display devices because it is a high-quality, high-temperature flexible material. There are two methods for peeling a polyimide flexible film substrate from a rigid substrate, one of which is laser peeling, and the other is mechanical peeling. Laser peeling requires dedicated laser equipment, which involves a huge investment, consuming a long time, and is difficult to ensure evenness. Mechanical peeling is relatively simple, but requires control on the peeling force, otherwise it will damage the display device.

SUMMARY

The present disclosure provides a method for manufacturing a flexible substrate includes: providing a carrier substrate; forming a photosensitive adhesive layer on the carrier substrate; providing a flexible substrate on the photosensitive adhesive layer, the flexible substrate including an active area and a non-active area; the photosensitive adhesive layer including a first area and a second area, curing photosensitive adhesive in the first area of the photosensitive adhesive layer with light irritation, and leaving photosensitive adhesive in the second area uncured; forming an element on the flexible substrate, with a non-active area of the element formed on the non-active area of the flexible substrate, an active area of the element formed on the active area of the flexible substrate, such that an orthographic projection of the non-active area of the flexible substrate on the carrier substrate covers an orthographic projection of the first area of the photosensitive adhesive layer on the carrier substrate, and an orthogonal projection of the second area of the photosensitive adhesive layer on the carrier substrate covers an orthogonal projection of the active area of the flexible substrate on the carrier substrate; cutting the carrier substrate along a boundary between the non-active area and the active area of the element such that the non-active area is separated from the active area; and separating the carrier substrate in the active area from the flexible substrate.

The method for manufacturing a flexible substrate includes: providing a mask on one side of the carrier substrate away from the photosensitive adhesive, wherein the mask includes a light transmitting area and a non-transmitting area, and light penetrating the light transmitting area cures the photosensitive adhesive of the first area.

In an exemplary embodiment, providing a flexible substrate on the photosensitive adhesive layer includes coating a flexible liquid material on the photosensitive adhesive layer and then curing the material to form a flexible substrate.

In an exemplary embodiment, the flexible substrate is a flexible display substrate, the non-active area is a non-display area of the flexible substrate, and the active area is a display area of the flexible substrate.

The method for manufacturing a flexible substrate includes providing the non-active area around the active area.

In an exemplary embodiment, the carrier substrate is a transparent substrate.

In an exemplary embodiment, the photosensitive adhesive is a UV-cured photosensitive adhesive.

The present disclosure also provides a flexible substrate manufactured with the method described above.

The present disclosure also provides a flexible display device manufactured with the method described above.

The flexible display device includes a liquid crystal display, an organic light emitting diode, or an electrophoretic display.

DETAILED DESCRIPTION

Figure 1:
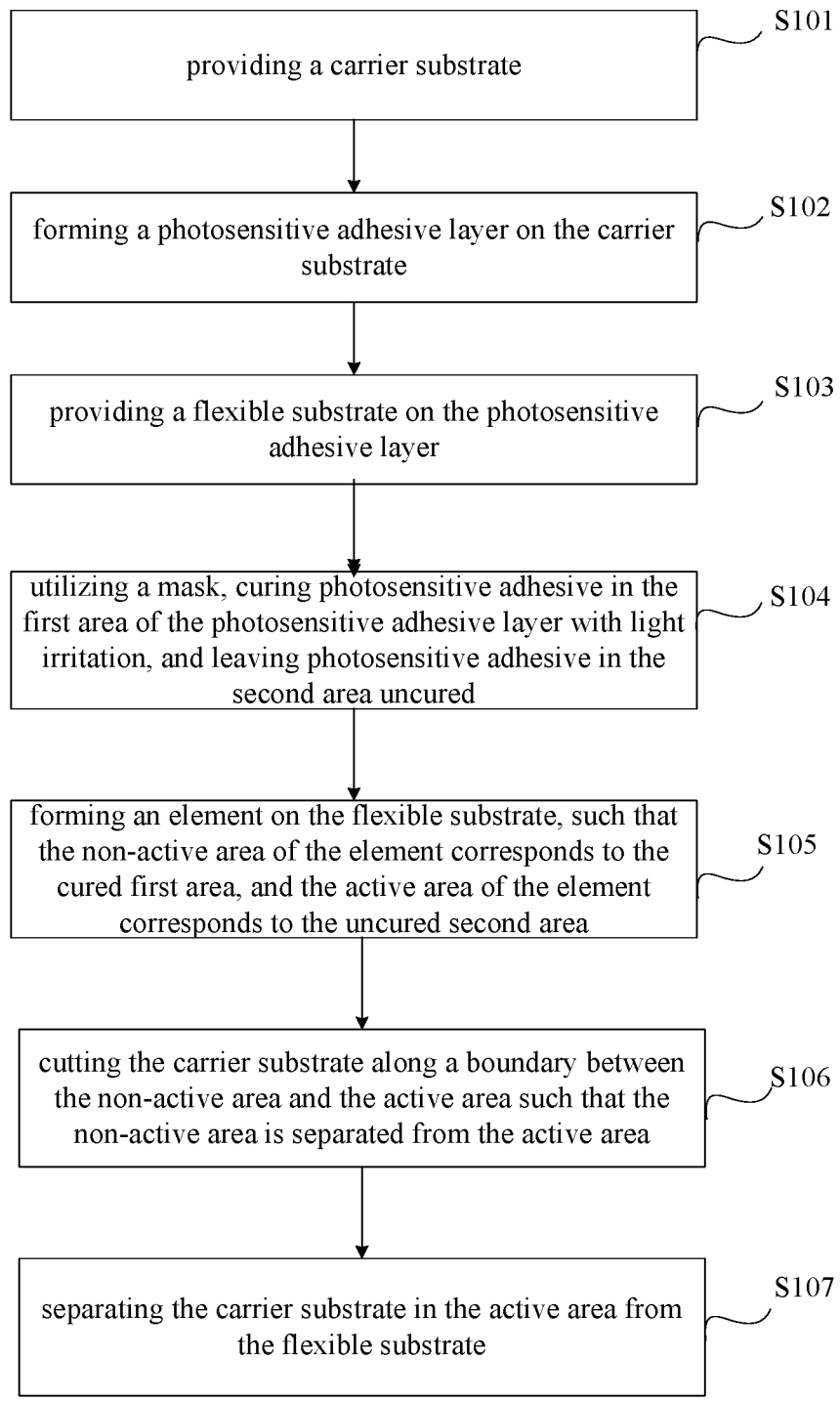
FIG. 1 is a flow chart of a method for manufacturing a flexible substrate according to an embodiment of the present disclosure.

The disclosure will be further described in detail below with reference to the accompanying drawings and embodiments. It is to be understood that the specific embodiments described herein are only used to explain the present disclosure and are not intended to limit the present disclosure. It should also be noted that for ease of description, only part of the structure related to the present disclosure, rather than the whole structure is shown in the drawings.

An embodiment of the present disclosure provides a method for manufacturing a flexible substrate. FIG. 1 is a flow chart of a method for manufacturing a flexible substrate according to an embodiment of the present disclosure.

As shown in FIG. 1, the method includes: first, in step S101, a carrier substrate 201 is provided; then in step S102, a photosensitive adhesive layer 202 is formed on the carrier substrate 201; and then in step S103, a flexible substrate 203 is provided on the photosensitive adhesive layer 202. The flexible substrate including an active area and a non-active area. The method for providing the flexible substrate 203 may be a method of directly adhering to a flexible substrate film after the photosensitive adhesive layer is coated, to form a flexible substrate, or a method of coating flexible liquid material on the photosensitive adhesive layer and then curing the material to form a flexible substrate. The flexible substrate formed by the method of coating flexible liquid material and then curing the material to form a flexible substrate has a relatively uniform thickness.

Then, the photosensitive adhesive layer 202 is cured with a mask 206. The process is: covering a side of the carrier substrate away from the photosensitive adhesive layer 202 with a patterned mask 206; curing the photosensitive adhesive layer 202 with ultraviolet light passing through the mask 206. The photosensitive adhesive layer 202 including a first area 202-1 and a second area 202-2, and the ultraviolet light can penetrate a partial area 206-1 on the mask 206, but cannot penetrate the other partial area 206-2 on the mask 206 such that the first area 202-1 on the photosensitive adhesive layer 202 is cured and the second area 202-2 is not be cured.

Next, in step S105, an element 204 is formed on the flexible substrate 203. The non-active area 204-1 of the element is formed on the non-active area of the flexible substrate 203, and the active area 204-2 of the element is formed on the active area of the flexible substrate 203, such that the non-active area 204-1 of the element corresponds to the cured first area 202-1 in the photosensitive adhesive layer 202, and the active area 204-2 of the element corresponds to the uncured second area 202-2 in the photosensitive adhesive layer 202. That is, an orthographic projection of the non-active area of the flexible substrate on the carrier substrate covers an orthographic projection of the first area 202-1 of the photosensitive adhesive layer on the carrier substrate, and an orthogonal projection of the second area 202-2 of the photosensitive adhesive layer on the carrier substrate covers an orthogonal projection of the active area of the flexible substrate on the carrier substrate.

The element may be a display device, including a display device such as a liquid crystal display, an organic light emitting diode, or an electrophoretic display, etc. In this case, the above non-active area is a non-display area of the display device, and the above-mentioned active area is a display area of the display device.

In addition to the display device, the element may also be an element for other applications such as a thin film transistor device. In this case, the non-active area of the thin film transistor corresponds to the cured area 202-1 of the corresponding photosensitive adhesive layer 202. The active area of the thin film transistor corresponds to the uncured area 202-2 of the corresponding photosensitive adhesive layer 202. In this case, the active area corresponds to the semiconductor active layer, the dielectric layer, and the metal electrode layer of the thin film transistor. The non-active area corresponds to the peripheral area on the substrate for fabricating the thin film transistor, which does not include the above-described semiconductor active layer, the dielectric layer, and the metal electrode layer.

Then, in step S106, the carrier substrate is cut along the boundary between the non-active area 204-1 and the active area 204-2, such that the non-active area and the active area are separated. In actual operation, since the active area is usually surrounded by the non-active area, the non-active area around the active area can be cut off.

Then in step S107, the carrier substrate and the flexible substrate are separated when the flexible substrate and the carrier substrate need to be separated after the element 204 (e.g., the display device) is completed.

After the non-active area is cut off, the remaining active area is weak in adhesion, since the photosensitive adhesive thereon has not been irritated and cured. The flexible substrate can be separated from the carrier substrate with a relatively small peeling force. It can prevent damage to the display device thereon during separation.

Figure 2:
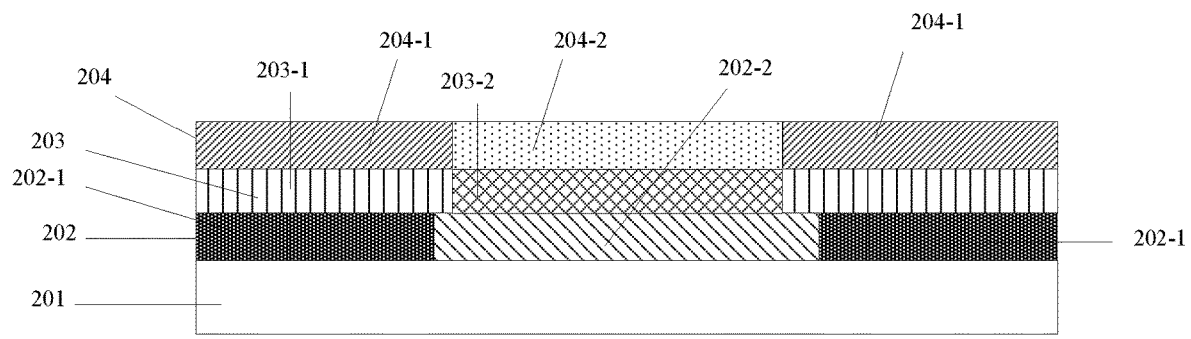
FIG. 2 is a schematic structural diagram of a flexible substrate in a manufacturing process according to an embodiment of the present disclosure.
Figure 2:
Figure 2:
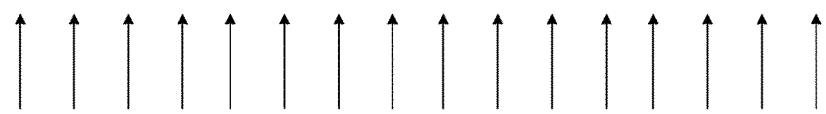

As can also be seen from FIG. 2, the area of the non-cured area 202-2 of the photosensitive adhesive layer 202 is larger than the area of the active area 204-2 of the element. Therefore, it can be ensured that the carrier substrate in the active area 204-2 can be easily separated from the flexible substrate after cutting. If the area of the non-cured area 202-2 of the photosensitive adhesive layer 202 is smaller than the area of the active area 204-2 of the element, after the cutting, some cured photosensitive adhesive may be left during separation of the carrier substrate and the flexible substrate, which may increase the difficulty of separation.

For the display device, the active area 204-2 shown in FIG. 2 may be an entire large area including all the display units, and the display unit may also be divided into several display areas.

Figure 3:
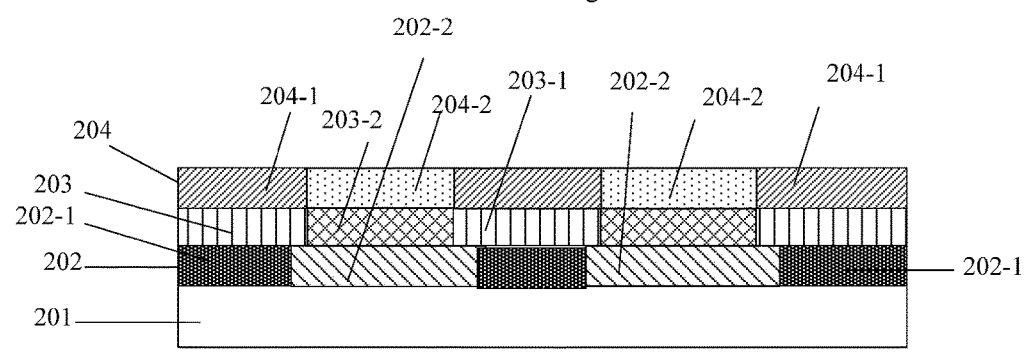
FIG. 3 is a schematic structural diagram of another flexible substrate in a manufacturing process according to an embodiment of the present disclosure.
Figure 3:
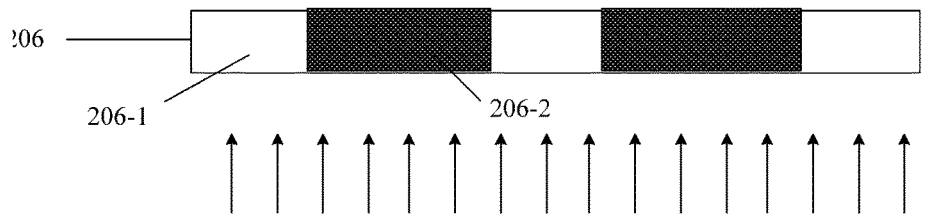

As shown in FIG. 3, the device 204 may be divided into a plurality of active areas 204-2. Accordingly, the mask 206 also includes a plurality of areas 206-2 which light cannot be transmitted through, such that there are a plurality of areas 202-2 with uncured photosensitive adhesive.

Each active area 204-2 corresponds to an area 202-2 with non-cured photosensitive adhesive. After the element is completed, the non-active area 204-1 is cut off to leave the active area 204-2. When the flexible substrate and the carrier substrate need to be separated, the carrier substrate in the active area 204-2 is separated from the flexible substrate.

According to the method for manufacturing the flexible substrate in this embodiment, the peeling force between the flexible substrate and the carrier substrate can be effectively reduced, so that it can avoid the damage to the device due to the excessively large peeling force when the flexible substrate and the device thereon are peeled from the carrier substrate by a mechanical peeling method. However, at the same time, it can be ensured that the flexible substrate and the carrier substrate are closely adhered to each other during the process, so as to prevent the flexible material from falling off the carrier substrate or causing excessive deformation or the like during the subsequent high-temperature process.

An embodiment of the present disclosure provides a flexible substrate manufactured with the method provided in the above embodiments, and further provides a flexible display device manufactured with the method provided above. The device is a display device and includes a liquid crystal display, an organic light emitting diode, or an electrophoretic display. An embodiment of the present disclosure also provides a flexible display apparatus including the above flexible display device.

The above is merely a preferred embodiment of the present disclosure and the principle of the applied technology. It should be understood by those skilled in the art that the present disclosure is not limited to the specific embodiments described herein, and various obvious modifications, variations, and substitutions can be made by those skilled in the art without departing from the scope of the disclosure. Therefore, although the present disclosure has been described in more detail through the above embodiments, the present disclosure is not limited to the above embodiments, and other equivalent embodiments may also be included without departing from the concept of the present disclosure. The scope of the present disclosure is defined by the appended claims.

What is claimed is:

1. A method for manufacturing a flexible substrate includes:

providing a carrier substrate;

forming a photosensitive adhesive layer on the carrier substrate, the photosensitive adhesive layer comprising a first area and a second area;

providing a flexible substrate on the photosensitive adhesive layer, the flexible substrate comprising an active area and a non-active area;

curing photosensitive adhesive in the first area of the photosensitive adhesive layer with light irritation, and leaving photosensitive adhesive in the second area uncured;

forming an element on the flexible substrate, with a non-active area of the element formed on the non-active area of the flexible substrate, an active area of the element formed on the active area of the flexible substrate, wherein an orthographic projection of the non-active area of the flexible substrate on the carrier substrate covers an orthographic projection of the first area of the photosensitive adhesive layer on the carrier substrate, and an orthogonal projection of the second area of the photosensitive adhesive layer on the carrier substrate covers an orthogonal projection of the active area of the flexible substrate on the carrier substrate;

cutting the carrier substrate along a boundary between the non-active area and the active area of the element such that the non-active area is separated from the active area; and separating the carrier substrate in the active area from the flexible substrate.

2. The method for manufacturing a flexible substrate according to claim 1, comprising: providing a mask on one side of the carrier substrate away from the photosensitive adhesive, wherein the mask comprises a light transmitting area and a non-transmitting area, and light penetrating the light transmitting area cures the photosensitive adhesive of the first area.

3. The method for manufacturing a flexible substrate according to claim 1, wherein the step of providing a flexible substrate on the photosensitive adhesive layer comprises coating a flexible liquid material on the photosensitive adhesive layer and then curing the material to form a flexible substrate.

4. The method for manufacturing a flexible substrate according to claim 3, wherein the flexible substrate is a flexible display substrate, the non-active area of the flexible substrate is a non-display area of the flexible substrate, and the active area of the flexible substrate is a display area of the flexible substrate.

5. The method for manufacturing a flexible substrate according to claim 1, comprising providing the non-active area around the active area.

6. The method for manufacturing a flexible substrate according to claim 1, wherein the carrier substrate is a transparent substrate.

7. The method for manufacturing a flexible substrate according to claim 1, wherein the photosensitive adhesive is a UV-cured photosensitive adhesive.

* * * * *